United States Patent
Gooch et al.

(10) Patent No.: US 9,484,228 B2
(45) Date of Patent: Nov. 1, 2016

(54) SIMULTANEOUS INDEPENDENTLY CONTROLLED DUAL SIDE PCB MOLDING TECHNIQUE

(71) Applicant: Apple Inc., Cupertino, CA (US)

(72) Inventors: Scott L. Gooch, San Carlos, CA (US); Shankar S. Pennathur, San Jose, CA (US)

(73) Assignee: Apple Inc., Cupertino, CA (US)

( * ) Notice: Subject to any disclaimer, the term of this patent is extended or adjusted under 35 U.S.C. 154(b) by 6 days.

(21) Appl. No.: 14/563,798

(22) Filed: Dec. 8, 2014

(65) Prior Publication Data

US 2016/0099159 A1    Apr. 7, 2016

Related U.S. Application Data

(60) Provisional application No. 62/058,514, filed on Oct. 1, 2014.

(51) Int. Cl.
*B29C 45/14* (2006.01)
*H01L 21/56* (2006.01)
(Continued)

(52) U.S. Cl.
CPC ............ *H01L 21/565* (2013.01); *B29C 45/02* (2013.01); *B29C 45/14655* (2013.01); *B29C 45/27* (2013.01); *B29C 45/766* (2013.01); *H01L 21/563* (2013.01); *H01L 21/568* (2013.01); *H05K 3/0091* (2013.01); *B29C 2945/762* (2013.01); *B29C 2945/76006* (2013.01); *B29C 2945/7611* (2013.01); *B29C 2945/76381* (2013.01); *B29C 2945/76498* (2013.01); *B29C 2945/76595* (2013.01); *B29C 2945/76678* (2013.01); *B29C 2945/76859* (2013.01);

(Continued)

(58) Field of Classification Search
CPC .................. H01L 21/565; B29C 45/14655
See application file for complete search history.

(56) References Cited

U.S. PATENT DOCUMENTS 5,665,296 A * 9/1997 Jain ................... B29C 45/14655
                                                    257/E21.504
6,100,598 A    8/2000 Kanesaka
(Continued)

FOREIGN PATENT DOCUMENTS

JP    H11 195659 A    7/1999
JP    2000 156385 A   6/2000
(Continued)

OTHER PUBLICATIONS

Schreier-Alt, et al., "Simulation and experimental analysis of large area substrate overmolding with epoxy molding compounds," Microelectronics Reliability, Elsevier Ltd., 2010, pp. 1-8.

(Continued)

*Primary Examiner* — Jill Heitbrink
(74) *Attorney, Agent, or Firm* — Blakely, Sokoloff, Taylor & Zafman LLP

(57) ABSTRACT

Molding assemblies and methods for dual side package molding are described. In an embodiment, a molding compound is injected into a front cavity with a first actuator, and a molding compound is injected into a back cavity with a second actuator, with the first and second actuator assemblies being independently controlled. In an embodiment, the molding compound flows through a through-hole in a molding substrate from a front side of the molding substrate to a back side of the molding substrate, and into the back cavity.

13 Claims, 13 Drawing Sheets

(51) Int. Cl.
  *B29C 45/27* (2006.01)
  *B29C 45/76* (2006.01)
  *B29C 45/02* (2006.01)
  *H05K 3/00* (2006.01)
  *B29L 31/34* (2006.01)
  *H05K 3/28* (2006.01)

(52) U.S. Cl.
  CPC ........ *B29L2031/3425* (2013.01); *H05K 3/284* (2013.01); *H05K 2203/1316* (2013.01)

(56) References Cited

U.S. PATENT DOCUMENTS

| | | |
|---|---|---|
| 6,106,259 A | 8/2000 | Lee et al. |
| 6,683,388 B2 | 1/2004 | Bolken |
| 6,989,121 B2 | 1/2006 | Thummel |
| 7,128,550 B2 | 10/2006 | Taniguchi |
| 7,303,720 B2 | 12/2007 | Fairy |
| 2004/0030441 A1 | 2/2004 | Bullock et al. |
| 2008/0230950 A1* | 9/2008 | Nishimura .............. B29C 45/02 264/277 |
| 2013/0140737 A1 | 6/2013 | Keong |
| 2014/0125918 A1 | 5/2014 | Takemura et al. |

FOREIGN PATENT DOCUMENTS

| | | |
|---|---|---|
| JP | 2005 191064 A | 7/2005 |
| JP | 2010 109252 A | 5/2010 |

OTHER PUBLICATIONS

PCT International Search Report and Written Opinion for International Application No. PCT/US2015/049818, mailed Jan. 22, 2016, 19 pages.

* cited by examiner

//. 9,484,228 B2

SIMULTANEOUS INDEPENDENTLY CONTROLLED DUAL SIDE PCB MOLDING TECHNIQUE

RELATED APPLICATIONS

This application claims the benefit of priority of U.S. Provisional Application No. 62/058,514 filed Oct. 1, 2014, which is incorporated herein by reference.

BACKGROUND

1. Field

Embodiments described herein relate to semiconductor packaging. More particularly embodiments relate to a dual side package molding technique.

2. Background Information

For system miniaturization, adopting a system in package (SiP) physical architecture is an attractive option, where all system electronic components are laid out on a fine pitch and over-molded for reliability and shielding purposes. Current substrate over-molding technology utilizes a single-sided molding technique.

SUMMARY

Molding assemblies, systems, methods, and molded packages are described. In an embodiment, a molding assembly includes a front mold block and a back mold block. The first mold block may include a first cull, a first runner in fluid communication with the first cull, a front cavity in fluid communication with the first runner, a second cull, and a second runner in fluid communication with the second cull. The second mold block may include a first pot alignable with the first cull, a second pot alignable with the second cull, a back cavity, and an intermediate runner alignable with the second runner and in fluid communication with the back cavity.

Location and length of the runners and cavities may be specific for dual side molding. For example, the first runner may be longer than the intermediate runner, and the second runner may be longer than the intermediate runner. In an embodiment, the first runner, the second runner, and the first cavity are in a same side of the front mold block, and the intermediate runner and the back cavity are in a same side of the back mold block. First and second cavity plungers may be coupled with the first and second pots, respectively. In an embodiment, first and second independently controllable actuator assemblies are coupled with the first and second cavity plungers, respectively.

The front and back mold blocks may include multiple blocks. In an embodiment, front mold block includes a first cull block and a front cavity block, and the back mold block includes a back cull block and a back cavity block. For example, the first cull block may include the first cull, the first runner, the second cull, and the second runner, and the back cull block may include the first pot, the second pot, and the intermediate runner.

In an embodiment, a molding method includes injecting a first molding compound through the first runner and into the front cavity of the front mold block on a front side of a molding substrate, such as a printed circuit board (PCB). A second molding compound is injected through the second runner, through a through-hole in the molding substrate from the front side of the molding substrate to a back side of the molding substrate, and into a back cavity of the back mold block on the back side of the molding substrate. In an embodiment, the second molding compound is injected through the through-hole from the front side of the molding substrate to the back side of the molding substrate and into an intermediate runner, and into the back cavity. First and second actuators can by actuated to inject the first and second molding compounds, respectively, with the first and second actuators being operated independently of each other. In an embodiment, the first and second molding compounds are injected across the front cavity and back cavities with a balanced flow.

In an embodiment, molding parameters are determined based upon a known PCB component layout. For example, non-transitory machine readable storage medium can provide instructions which, when executed by a processor, cause the processor to perform operations that include receiving a PCB component layout for a mapping model, executing the mapping model for the PCB, generating independent plunger assembly parameters for a front mold block actuator and a back mold block actuator, and inputting the independent plunger assembly parameters into a molding system. In an embodiment, the plunger assembly parameters include plunger speed and plunger pressure for both the front and back mold block assemblies. In an embodiment, a mold flow simulation is generated that includes a front mold block molding compound moving wavefront and a back mold block molding compound moving wavefront.

DETAILED DESCRIPTION

Figure 1:
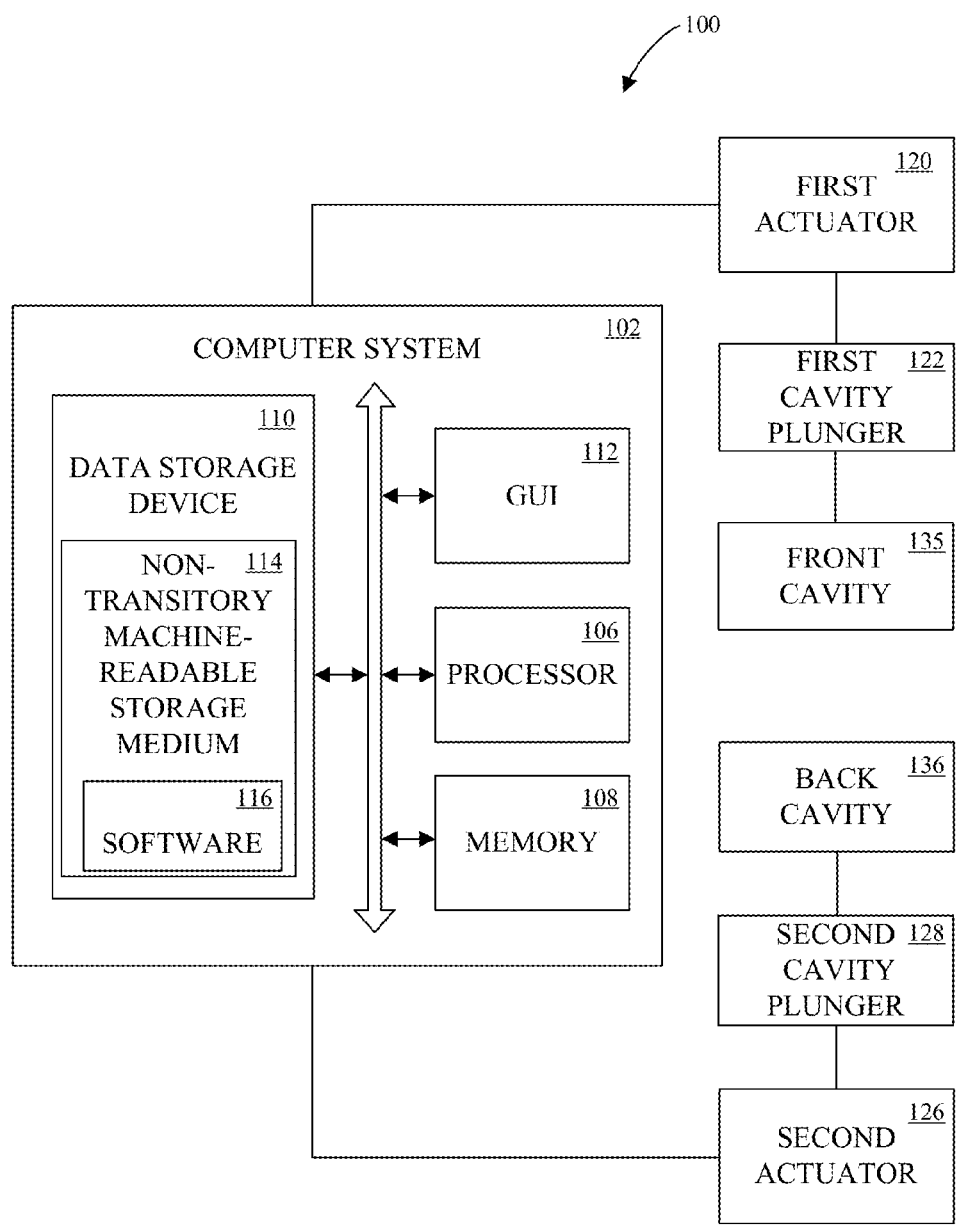
FIG. 1 is a schematic illustration of a molding system in accordance with an embodiment.

Embodiments describe a methodology for simultaneous dual side package molding. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between" and "on" as used herein may refer to a relative position of one layer with respect to other layers. One layer "above", "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe molding systems, molding assemblies, and methods in which a molding substrate such as a printed circuit board (PCB) is designed with through-holes for simultaneous dual side molding of a molding substrate. In one embodiment the front and back cavities are fed by the same plunger. In such an embodiment, a molding compound is injected into a runner on a front side of a molding substrate, into a front cavity in a front mold block, through the through-hole in the molding substrate, and into a back cavity in a back mold block. In another embodiment, independent plunger control is used to feed the front and back mold block cavities. In such an embodiment, the through-holes in the molding substrate accommodate various runner designs in mold blocks, such as cull blocks and cavity blocks. In application, the front mold block cavity may be fed by injecting a molding compound with a first plunger into a first runner on the front side of the molding substrate, and into a front cavity of the front mold block. The back mold block cavity is fed by injecting a molding compound with a second plunger into a second runner on a front side of the molding substrate, through a through-hole in the molding substrate, into an intermediate runner on a back side of the molding substrate, and into a back cavity of the back mold block.

Independent plunger control may enable a balanced flow and balance the pressure within the front and back cavities to, particularly when component (e.g. die) layout on the front and back sides of the molding substrate are different, such as different sizes, density, z-height, etc. In an embodiment, matching the wavefronts of the molding compound on the front and back sides of the molding substrate can create a balanced flow and balanced cavity pressures to address bending or collapse of the molding substrate. In an embodiment in which the same plunger feeds both the front and back cavities, it is envisioned that a through-hole layout in the molding substrate may assist in creating a balanced flow and balanced pressures on opposite sides of the molding substrate.

In another aspect, embodiments describe a molding assembly that is compatible with the tooling for conventional degating and ejection systems. For example, with a conventional single-sided molding technique, a degating operation may include tilting an outer edge of the molding substrate relative to the front mold block in order to separate the molding compound in the molded cavity on the molding substrate from the molding compound in the runners in the front mold block such that the molding compound within the runners is broken off of the molding substrate. In an embodiment, runners in the front mold block are longer than runners in the back mold block. In such a configuration, a dual side molded substrate may be degated using conventional single sided degating techniques, without the need for a second degating operation or excessive runner material remaining on the molded substrate.

In another aspect, embodiments describe a computer implemented mapping model for generating plunger parameters, such as plunger speed and plunger pressure, based upon a molding substrate (e.g. PCB) component layout. Thus, a specific PCB component layout can be processed using the computer implemented mapping model to determine the plunger parameters for feeding the molding compound to the front and back mold block cavities. In an embodiment, the mapping model generates independent plunger parameters for simultaneously and independently feeding the molding compound into the front and back mold block cavities. A mold flow simulation for the molding compound moving wavefront may additionally be output for visual confirmation and validation of the plunger parameters. In addition, a loop feedback from the plunger parameters or mold flow simulation may be fed back into the mapping model or PCB component layout design for additional refinement of the plunger parameters or PCB component layout design.

Referring now to FIG. 1 a schematic illustration of a molding system 100 is shown in accordance with an embodiment. As illustrated in FIG. 1, a computer system 102 is operably coupled with a first actuator 120, which in turn is coupled with a first cavity plunger 122, which in turn is in fluid communication with front cavity 135. In this manner, the computer system controls operation of the first actuator 120, which drives the first cavity plunger 122 to fill the front cavity 135 cavity with a molding compound. The computer system 102 may also be operably coupled with a second actuator 126, which in turn is coupled with a second cavity plunger 128, which in turn is in fluid communication with a back cavity 136. In this manner, the computer system controls operation of the second actuator 126, which drives the second cavity plunger 128 to fill the back cavity 136 with a molding compound.

In an embodiment, computer system 102 of FIG. 1 includes an address/data bus 104 for communicating information, and a central processor unit 106 coupled to bus 104 for processing information and instructions. Computer system 102 also includes data storage features 108 such as a computer usable volatile memory, e.g. random access memory (RAM), coupled to bus 104 for storing information and instructions for central processor unit 106, computer usable non-volatile memory, e.g. read only memory (ROM), coupled to bus 104 for storing static information and instructions for the central processor unit 106, and a data storage device 110 (e.g., a magnetic or optical disk and disk drive) coupled to bus 104 for storing information and instructions. Computer system 102 also includes a graphical user interface 112 coupled to bus 104 for communicating information and command selections to central processor unit 106 and for displaying information.

The data storage device 110 may include a non-transitory machine-readable storage medium 114 on which is stored one or more sets of instructions (e.g. software 116) embodying any one or more of the methodologies or operations described herein. Software 116 may also reside, completely or at least partially, within the volatile memory, non-volatile memory, and/or within processor 106 during execution thereof by the computer system 102, the volatile memory, non-volatile memory, and processor 106 also constituting non-transitory machine-readable storage media.

It is to be appreciated that computer system 102 is exemplary, and that embodiments can operate on or within, or be controlled by a number of different computer systems including general purpose networked computer systems, embedded computer systems, routers, switches, server devices, client devices, various intermediate devices/nodes, stand alone computer systems, and the like.

Figure 2:
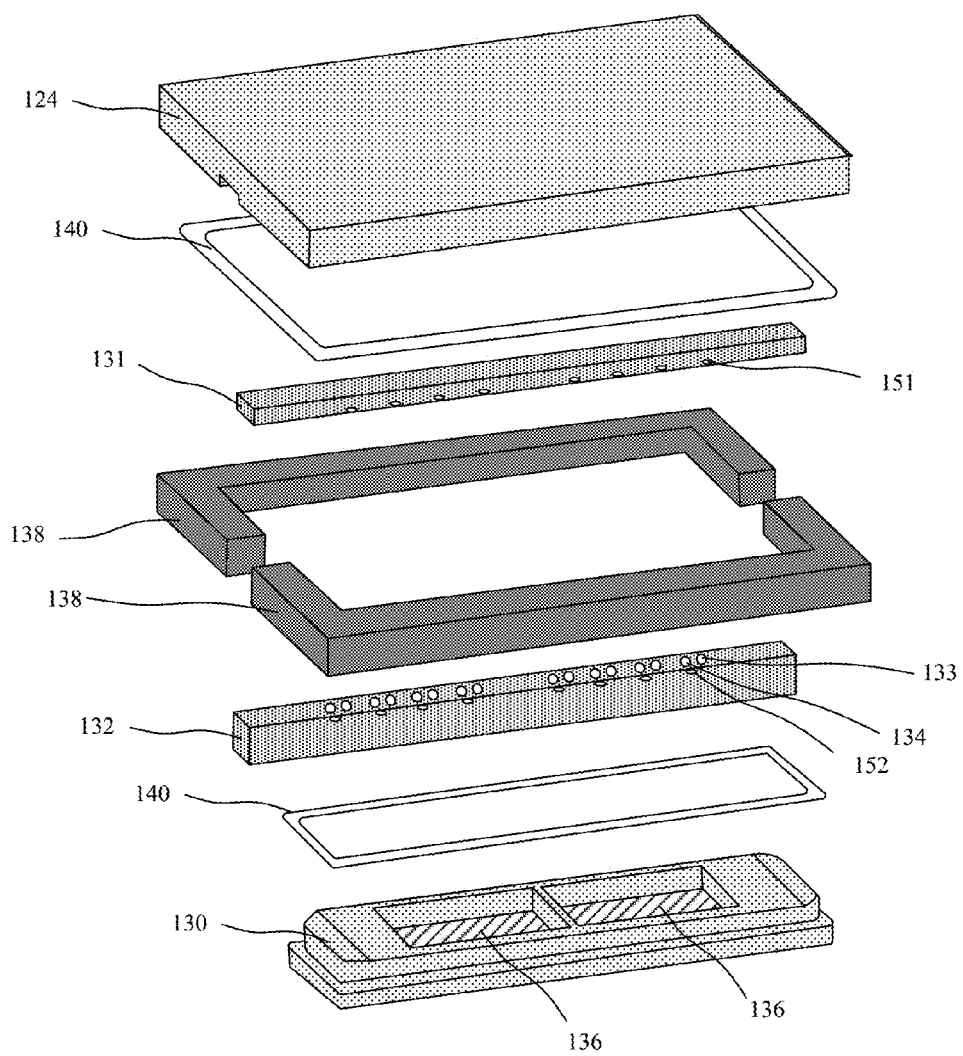
FIG. 2 is an exploded perspective view of molding assembly components in accordance with an embodiment.

FIG. 2 is an exploded perspective view of molding assembly components in accordance with an embodiment. The molding assembly components illustrated in FIG. 2 include a front cavity block 124 including one or more front cavities 135 (not shown in FIG. 2), a front cull block 131, back cull block 132, and a back cavity block 130 including one or more back cavities 136. The back cull block 132 includes an arrangement of pots 133, 134. The pots 133, 134 may extend through a back side to a front side of the back cull block 132. As will be described in further detail below, when assembled together, pot 133 in the back cull block 132 may be in fluid communication with a first runner 151 in the front cull block 131, and front cavity 135 in the front cavity block 124. Likewise, pot 134 in the back cull block 132 may be in fluid communication with a second runner 152 in the back cull block 132, and back cavity 136 in the back cavity block 130, when assembled.

Mold chase assembly 138 may be arranged around the front and back cull blocks 131, 132 to facilitate coupling with the front cavity block 124 and back cavity block 130. Seals 140, such as O-rings, may be used to fluidly seal the components together. In the particular embodiment illustrated, a single back cavity block 130 and corresponding seal 140 are illustrated. The particular arrangement allows for two back cavity blocks 130 to be arranged on opposite sides of the back cull block 132, though a second cavity block is not illustrated to not obscure the other illustrated molding assembly components and features. It is to be appreciated, that such a configuration is exemplary, and that embodiments are not limited to the particular embodiment illustrated. For example, the particular molding assembly illustrated in FIG. 2 is a side gate molding assembly in which the molding compound is injected into the molding cavities at side gates. While the following embodiments are described and illustrated with regard to a side gate, embodiments are not so limited and may be compatible with alternative configurations such as top gate, pin gate or fan gate.

Figure 3:
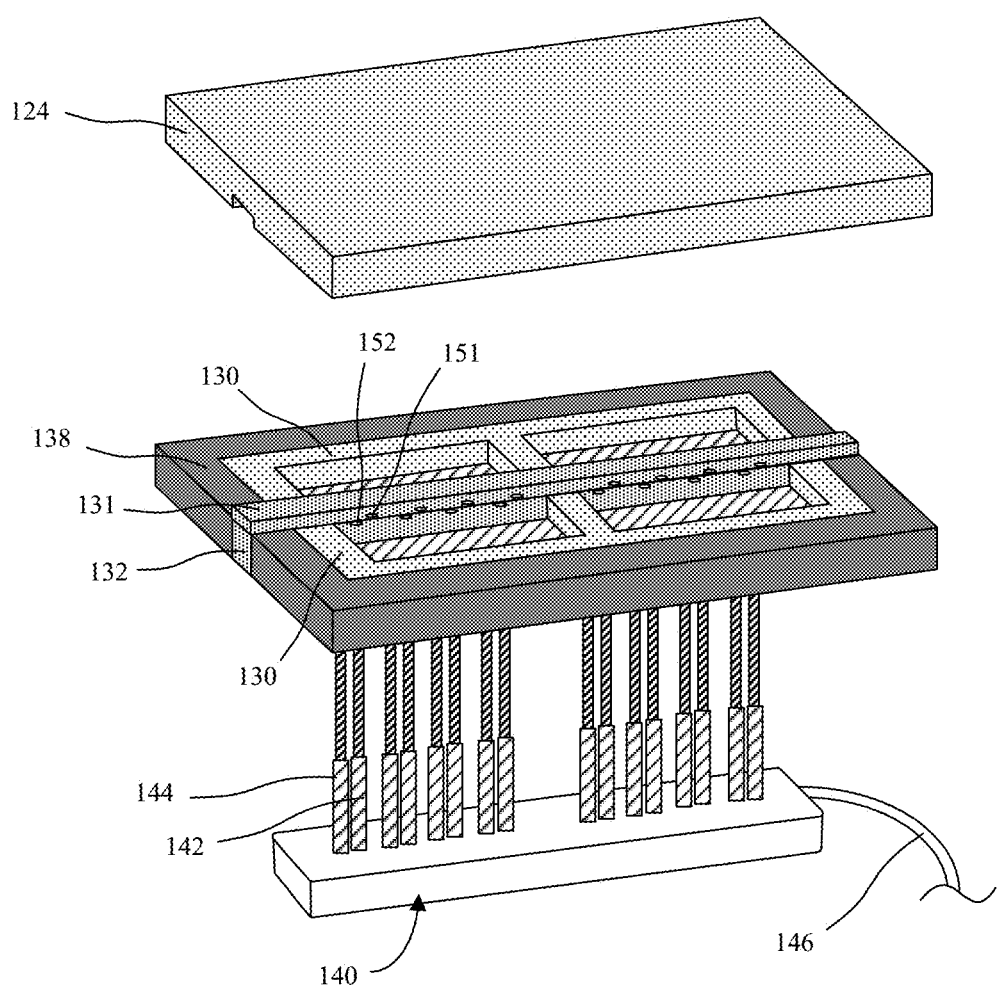
FIG. 3 is a perspective view of partially assembled molding assembly components in accordance with an embodiment.

FIG. 3 is a perspective view of partially assembled molding assembly components in accordance with an embodiment. In the particular embodiment illustrated, two back mold blocks 130 have been coupled with the back cull block 132, front cull block 131, and mold chase assembly 138 illustrated in FIG. 2. In addition an actuator assembly 140 including one or more pairs of independently operable actuators 142, 144 is arranged with the pots 133, 134, respectively. Thus, actuator 142 is operably coupled with a plunger moveable within pot 133 for filling a front cavity 135, and actuator 144 is operably coupled with plunger movable within pot 134 for filling a back cavity 136. The actuator assembly 140 is illustrated as including an electrical connection 146 for communicating with the computer system 102 and/or power source.

In the following description, the front cavity block 124 and front cull block 131 are referred to together as a front mold block 154. Similarly the back cavity block 130 and back cull block 132 are referred to together as a back mold block 156. In particular, specific runner configurations are described as running through either a cavity block or cull block, though it is contemplated that a runner described as running through a cull block could alternatively, or additionally, run through a corresponding cavity block, or that a cull block and cavity block could be an integrally formed mold block.

Figure 4A:
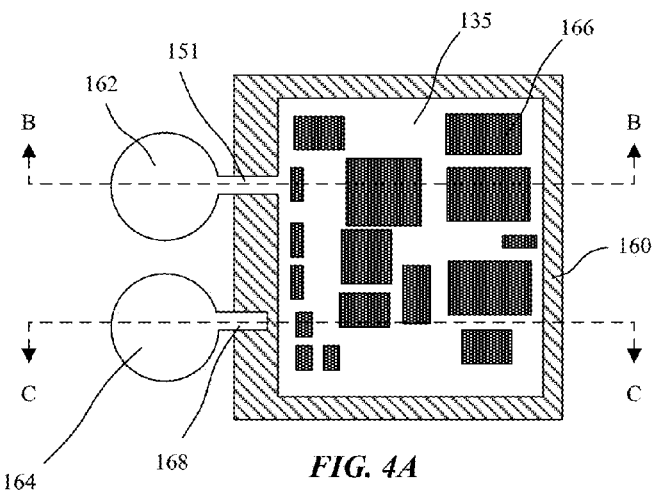
FIG. 4A is a schematic front view illustration of a front mold block and molding substrate in accordance with an embodiment.

Referring now to FIG. 4A, a schematic front view illustration is provided of a front mold block 154 and molding substrate 160 in accordance with an embodiment. Molding substrate may be any suitable substrate, such as a PCB. In the embodiment illustrated, the molding substrate 160 includes one or more die 166 mounted on a front side thereof. As illustrated, the front mold block 154 includes a front cavity 135 in fluid communication with a first runner 151 and a first cull 162. In the illustrated embodiment, the front mold block 154 additionally includes a second cull 164 in fluid communication with a second runner 168. As illustrated, the second runner 168 is not in fluid communication with the front cavity 135.

Figure 4B:
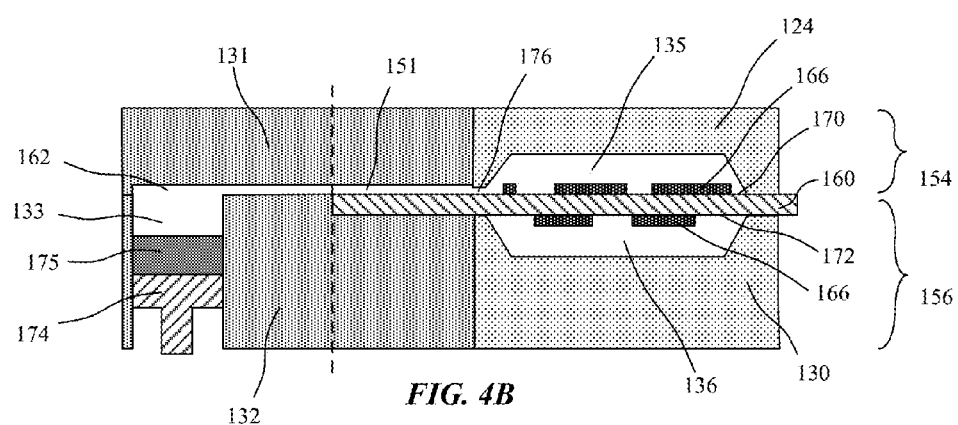
FIG. 4B is a cross-sectional side view illustration of a front mold block, back mold block, and molding substrate taken along line B-B of FIG. 4A in accordance with an embodiment.

FIG. 4B is a cross-sectional side view illustration of a front mold block 154, back mold block 156, and molding substrate 160 taken along line B-B of FIG. 4A in accordance with an embodiment. As illustrated, one or more die 166 may be formed on each of the front side 170 and back side 172 of the molding substrate 160. A first cavity plunger 174 is coupled with and movable within the pot 133 in the back mold block 156. The first cavity plunger 174 may be operably coupled with the first actuator 142. For example, the first cavity plunger 174 may be coupled with and movable within the pot 133 of the back cull block 132. In the embodiment illustrated, the first pot 133 is alignable with the first cull 162. When aligned, a fluid path exists from the pot 133, to first cull 162, through the first runner 151, and into the front cavity 135. In an embodiment, a front gate 176 is formed in the front cavity block 124 to define an entrance to the front cavity 135.

Figure 4C:
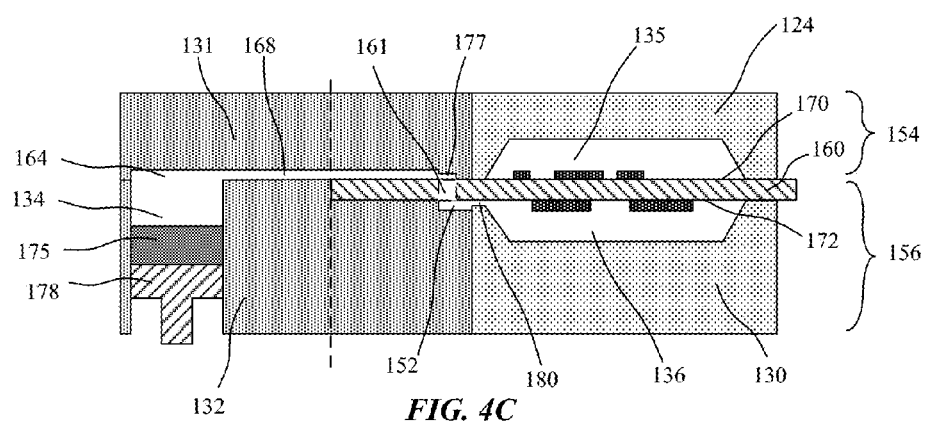
FIG. 4C is a cross-sectional side view illustration of a front mold block, back mold block, and molding substrate taken along line C-C of FIG. 4A in accordance with an embodiment.

FIG. 4C is a cross-sectional side view illustration of a front mold block 154, back mold block 156, and molding substrate 160 taken along line C-C of FIG. 4A in accordance with an embodiment. A second cavity plunger 178 is coupled with and movable within the second pot 134 in the back mold block 156. The second cavity plunger 178 may be operably coupled with the second actuator 144. For example, the second cavity plunger 178 may be coupled with and movable within the pot 134 of the back cull block 132. In the embodiment illustrated, the second pot 134 is alignable with the second cull 164. When aligned, a fluid path exists from the pot 134, to second cull 164, through the second runner 168, through a through-hole 161 formed in the molding substrate 160 (from the front side 170 to the back side 172), into a intermediate runner 152, and into the back cavity 136. In an embodiment, an intermediate gate 177 is formed in the front cull block 131 to provide a breaking point for the second runner 168. In an embodiment, a back gate 180 is formed in the back cavity block 130 to define an entrance to the back cavity 136. In an embodiment, the first runner 151 and second runner 168 are longer than the intermediate runner 152. For example, such a configuration may aid in degating the molding compound in the filled cavities 135, 136 from the runners.

Referring to FIGS. 4B-4C, in the particular embodiment illustrated the molding substrate 160 fits between the front mold block 154 and back mold block 156. A boundary between the front and back cull blocks 131, 132 and the front and back cavity blocks 124, 130 is shown by the shading. Another embodiment is illustrated by the dotted line in both FIGS. 4B-4C, indicating an alternative boundary between the front and back cull blocks 131, 132 and the front and back cavity blocks 124, 130. In such an embodiment, the molding substrate does not extend into the front and back cull blocks 131, 132 and instead is contained in the front and back cavity blocks 124, 130.

In operation, pellets 175 or granules of molding compound can placed in the first and second pots 133, 134 for molding the front cavity 135 and back cavity 136. The front mold block 154 and back mold block 156 may be heated to a suitable temperature to transform the molding compound pellets 175 or granules from a solid state to liquid state. Likewise, liquid molding compound can be loaded into the front mold block and back mold block 156. Thus, the molding systems and assemblies described herein are not limited to a particular form of molding compound. The first cavity plunger 174 is then independently operated by the first actuator 142, and the second cavity plunger 178 is independently operated by the second actuator 144.

Figure 5A:
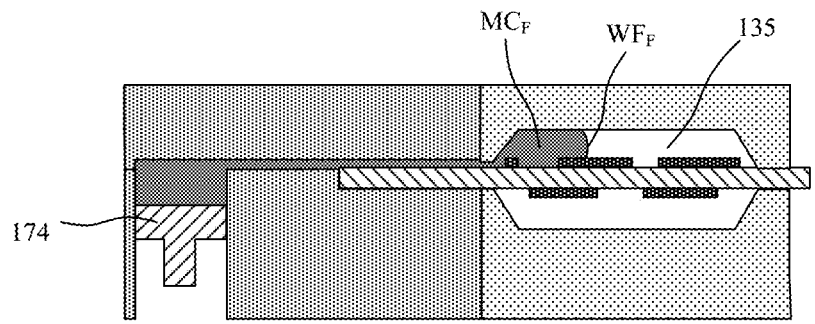
FIG. 5A is a cross-sectional side view illustration of a front mold block, back mold block, and molding substrate taken along line B-B of FIG. 4A in accordance with an embodiment.
Figure 5B:
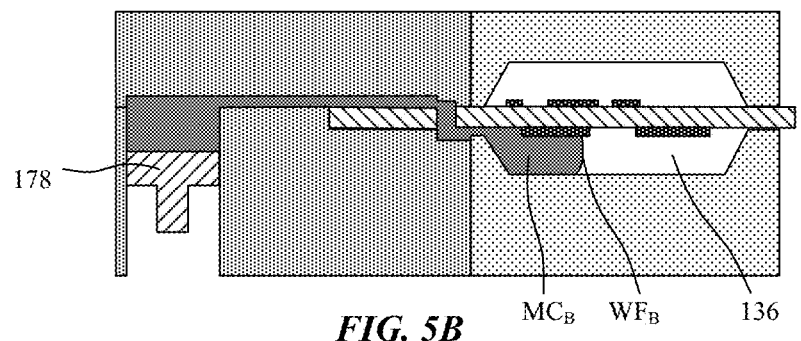
FIG. 5B is a cross-sectional side view illustration of a front mold block, back mold block, and molding substrate taken along line C-C of FIG. 4A in accordance with an embodiment.
Figure 6A:
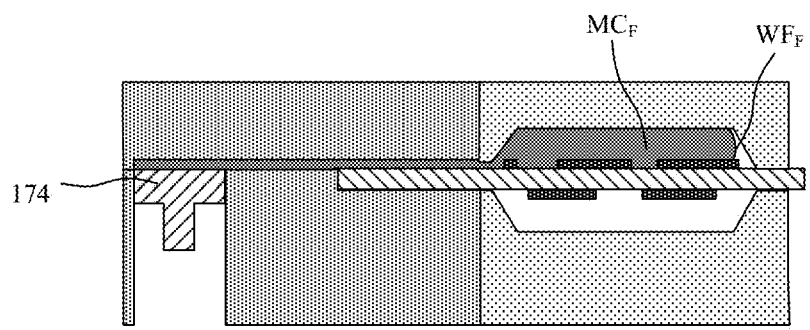
FIG. 6A is a cross-sectional side view illustration of a front mold block, back mold block, and molding substrate taken along line B-B of FIG. 4A in accordance with an embodiment.
Figure 6B:
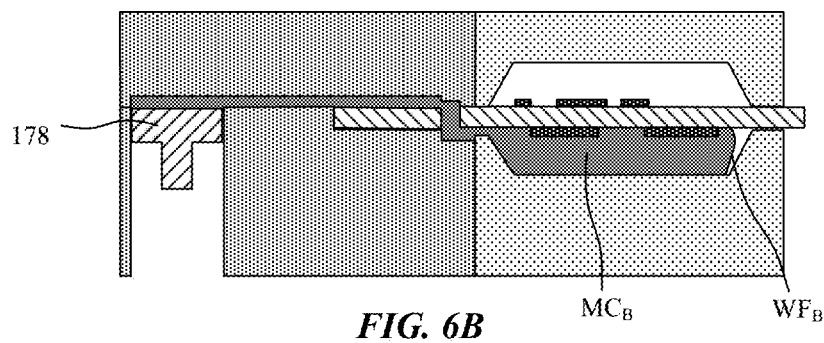
FIG. 6B is a cross-sectional side view illustration of a front mold block and back mold block taken along line C-C of FIG. 4A in accordance with an embodiment.

FIGS. 5A-5B are cross-sectional side view illustrations of a front mold block, back mold block, and molding substrate taken along line B-B and C-C of FIG. 4A after the molding compound has been partly injected into the front cavity 135 and back cavity 136 in accordance with an embodiment. As illustrated in FIG. 5A, molding compound $MC_F$ travels along the path from first pot 133, to first cull 162, through the first runner 151, through the front gate 176, and into the front cavity 135. As illustrated in FIG. 5B, molding compound $MC_B$ travels along the path from second pot 134, to second cull 164, through the second runner 168, through the intermediate gate 177, through a through-hole 161 formed in the molding substrate 160 (from the front side 170 to the back side 172), into a intermediate runner 152, through the back gate 180, and into the back cavity 136. FIGS. 6A-6B are cross-sectional side view illustrations similar to those in FIGS. 5A-5B, after the molding compound $MC_F$ and $MC_B$ have been injected further into the front cavity 135 and back cavity 136. In the embodiments illustrated, a wavefront $WF_F$ of the molding compound $MC_F$ injected into the front cavity 135 is within a specified distance of the wavefront $WF_B$ of the molding compound $MC_B$ injected into the back cavity 136. As shown, the wavefronts $WF_F$, $WF_B$ correspond to the leading edges of the molding compounds $MC_F$, $MC_B$ being injected into the front and back cavities 135, 136.

In accordance with embodiments, the molding assembly design enables independent plunger control for feeding the molding compound to the front and back sides of a molding substrate, such as a PCB including a known component (e.g. die 166) layout on the front and back sides of the molding substrate. As a first aspect, embodiments describe a molding assembly design that enables simultaneous dual side molding of a molding substrate. As a second aspect, embodiments describe a molding process that includes independent plunger control to independently control injecting the molding compound into the front and back cavities. The plunger pressure, and plunger speed relate to the pressure placed on the molding compound within the molding cavity, and speed which the molding compound fills the molding cavity. The rate at which the molding compound fills the cavity can be represented by the wavefront, which is a significant factor in the resultant pressure (cavity pressure) within a corresponding cavity. In an embodiment, matching the wavefronts $WF_F$, $WF_B$ of the molding compound on the front and back sides of the molding substrate can create a balanced flow and balance the cavity pressure within the front and back cavities. In such an embodiment, any pressure differential between the front and back cavities is not significant enough to cause substantial bending or collapse of the molding substrate. Furthermore, independent plunger control may enable a balanced flow and balanced cavity pressures when component (e.g. die 166) layout on the front and back sides of the molding substrate are different, such as different sizes, density, z-height, etc.

Figure 7:
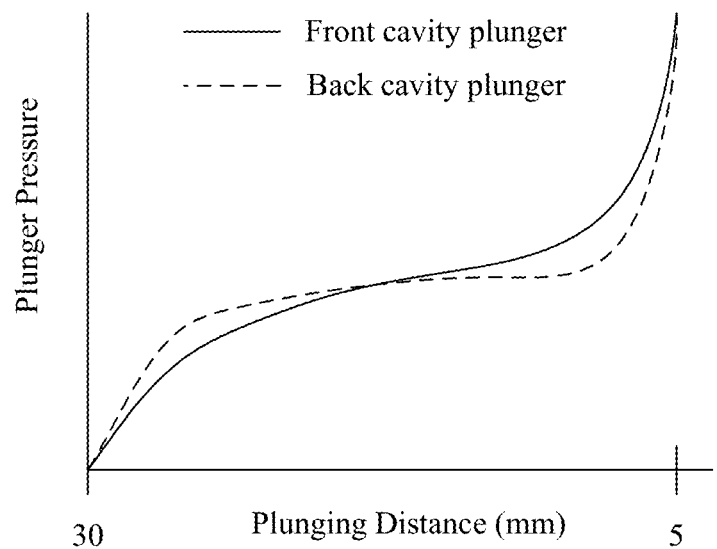
FIG. 7 is a graphical illustration of plunger pressure and plunging distance for independently controlled plungers in accordance with an embodiment.

Referring to FIG. 7, a graphical illustration of plunger pressure and plunging distance is provided for independently controlled plungers in accordance with an embodiment. In the embodiment illustrated, plunger pressure is different for the front cavity plunger 174 and back cavity plunger 178 over the plunging distance, which is represented as 30 mm at the start, and down to 5 mm upon completion of the molding compound injection operation.

Figure 8:
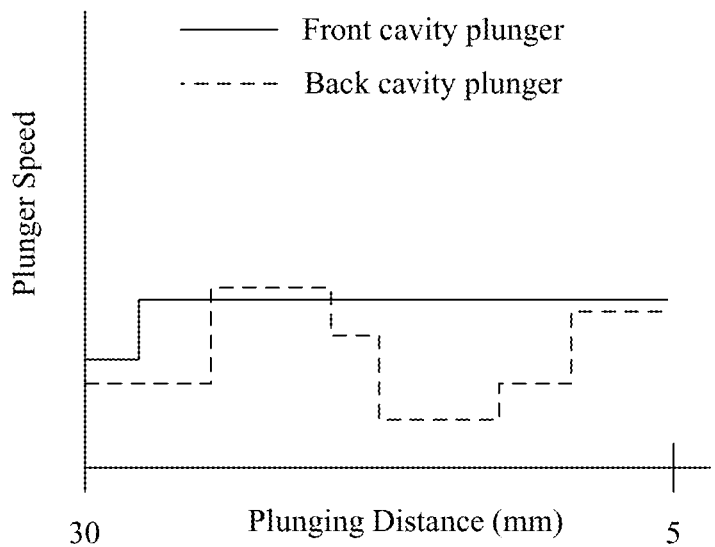
FIG. 8 is a graphical illustration of plunger speed and plunging distance for independently controlled plungers in accordance with an embodiment.

FIG. 8 is a graphical illustration of plunger speed and plunging distance for independently controlled plungers in accordance with an embodiment. In the embodiment illustrated, plunger speed is different for the front cavity plunger 174 and back cavity plunger 178 at specific portions of the plunging distance. In the embodiment illustrated, the front cavity plunger 174 can be maintained as a substantially uniform plunger speed, while the plunger speed of the back cavity plunger 178 is varied more often in order to achieve a balanced flow. It is to be appreciated, that the particular plunger parameter relationships illustrated in FIGS. 7 and 8 are for illustrational purposes, and the actual plunger parameters in application may be characterized by profiles different than those illustrated.

In an embodiment, the plunger assembly parameters, such as plunger speed and plunger pressure, are derived from the molding substrate, e.g. PCB, component layout using an algorithmic approach that ties the molding process directly to a specific PCB layout design. Thus, the molding process and plunger assembly parameters are specific to a specific PCB layout design.

Figure 9:
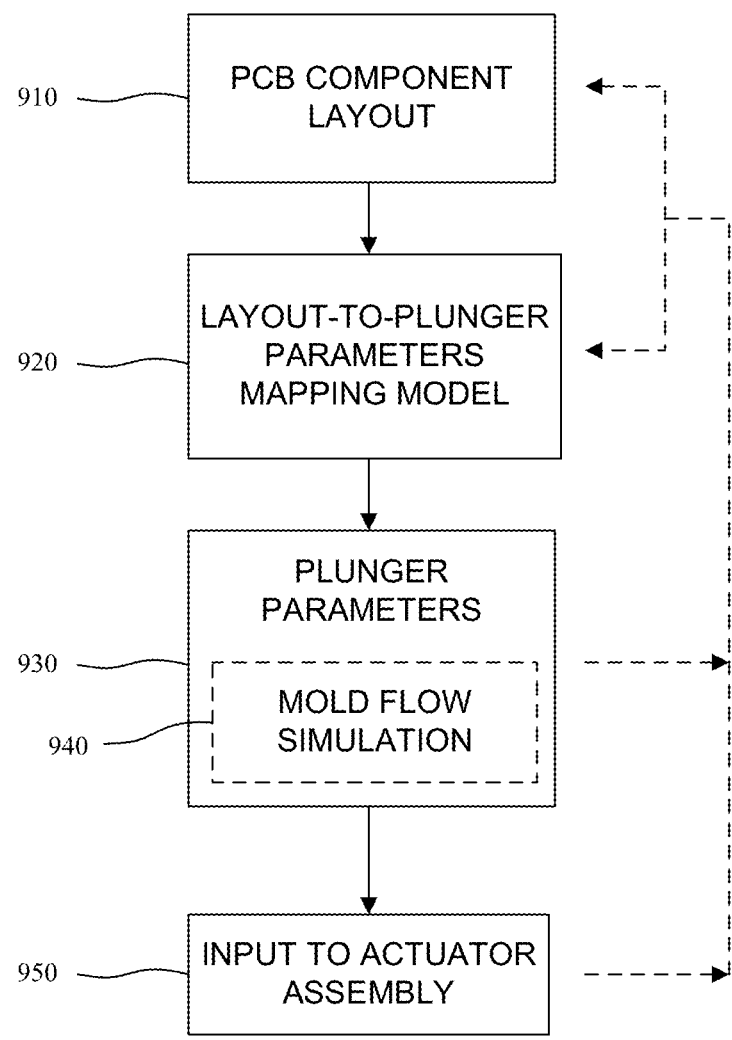
FIG. 9 is an illustration of a method of generating plunger assembly parameters in accordance with an embodiment.
Figure 10A:
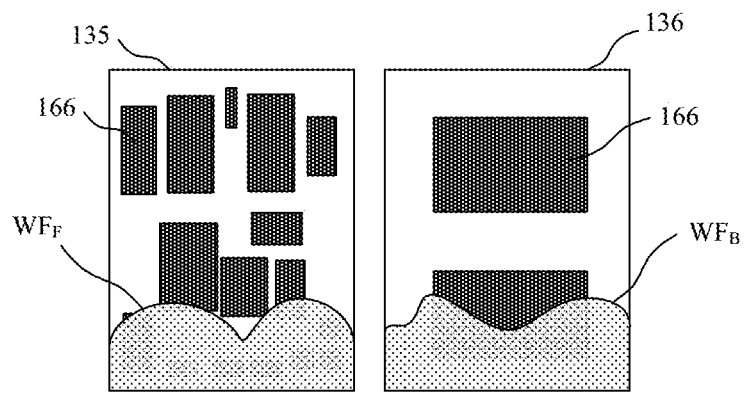
FIGS. 10A-10C are illustrations of a mold flow simulation of molding compound into the front and back cavities at various moments in time in accordance with an embodiment.
Figure 10B:
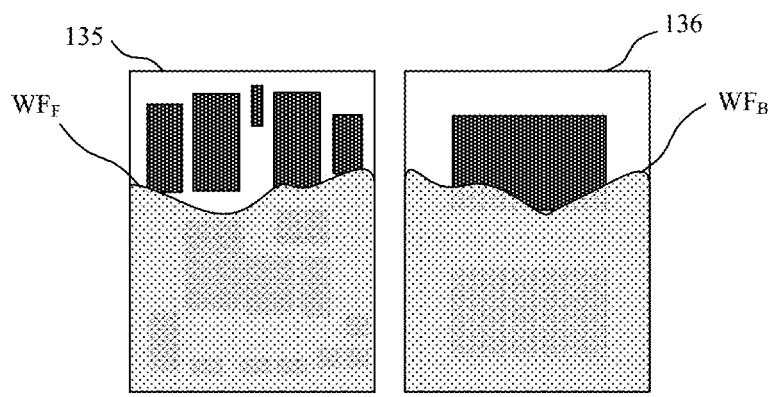
Figure 10C:
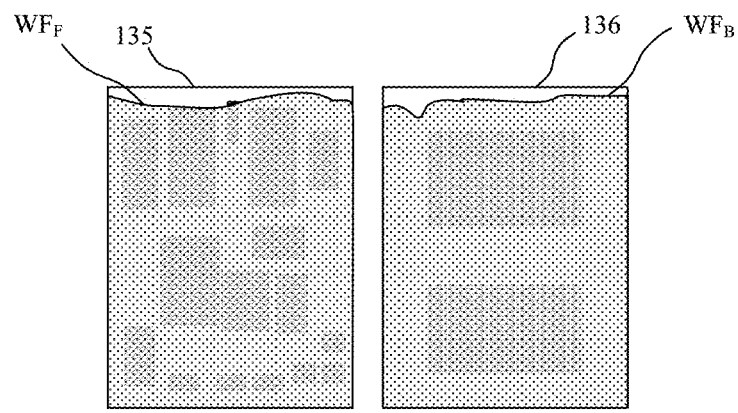

FIG. 9 is an illustration of a method of generating plunger assembly parameters in accordance with an embodiment. At operation 910, a PCB component layout is provided for a PCB board to be molded. For example, the PCB component layout may be provided to the computer system 102 in FIG. 1. The processor 106 then executes the software 116 instructions at operation 920 that includes layout-to-plunger parameters mapping model, and the computer system outputs plunger parameters at operation 930. The plunger parameter may be independent of one another. For example, the plunger parameters may include independent plunger pressure or speed as described with regard to FIGS. 6A-8 to create a balanced flow and matching wavefronts of the molding compound in the front and back cavities. Following the output of the plunger parameters at operation 930, the plunger parameters are input to an actuator assembly, such as actuator assembly 140, for operation of independently controlled actuators 142, 144. In an embodiment, a mold flow simulation 940 is output from the computer system. For example, the mold flow simulation 940 maybe displayed on a graphical user interface 112. Referring briefly, to FIGS. 10A-10C a mold flow simulation of molding compound into the front and back cavities at various moments in time is illustrated in accordance with an embodiment. Thus, the mold flow simulation may be a dynamic, and continuous progression illustration the projected mold flow wavefronts. FIG. 10A illustrates an early moment as the molding compound is initially flowed into the front cavity and back cavity. FIGS. 10B-10C illustrate progressively later moments in time. In the embodiment illustration in FIGS. 10A-10C, the mold flow simulation 940 provides a comparison of the wavefronts $WF_F$, $WF_B$ during molding. Referring again to FIG. 9, the mold flow simulation process may be a looped process. For example, if output plunger parameters or mold flow simulation are not within specified ranges or tolerances, the data can be looped back into a PCB component layout, or the layout-to-plunger parameters mapping model.

Figure 11A:
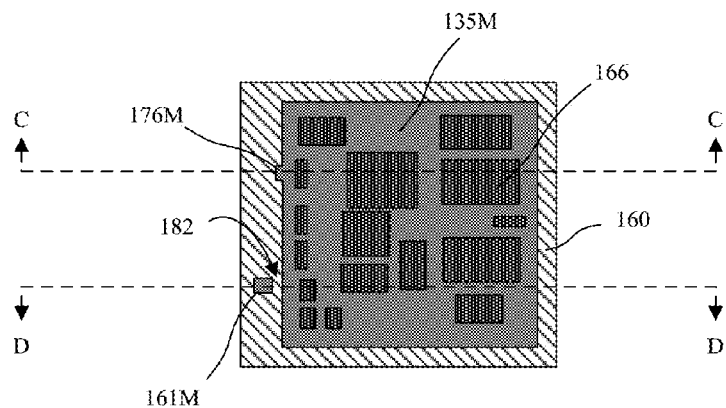
FIG. 11A is a front view illustration of a molded package in accordance with an embodiment.
Figure 11B:
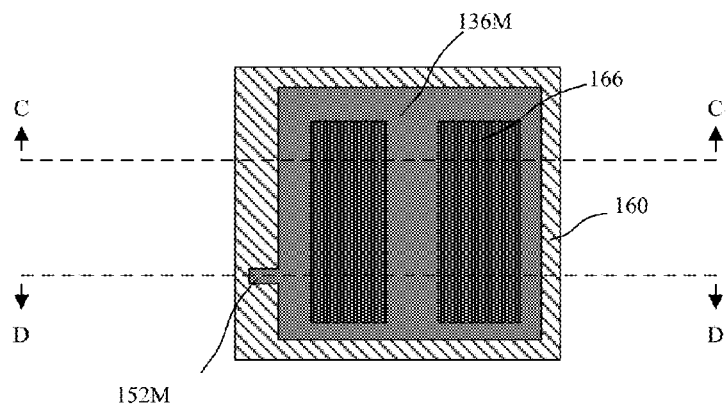
FIG. 11B is a back view illustration of a molded package in accordance with an embodiment.
Figure 11C:
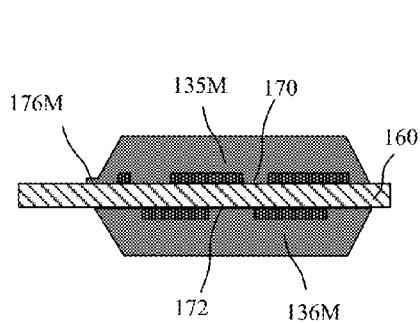
FIG. 11C is a cross-sectional side view illustration of a molded package taken along lines C-C of FIGS. 11A and 11B in accordance with an embodiment.
Figure 11D:
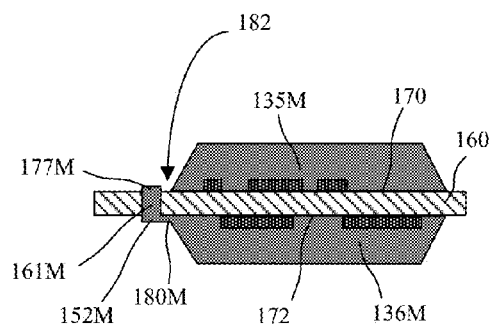
FIG. 11D is a cross-sectional side view illustration of a molded package taken along lines D-D of FIGS. 11A and 11B in accordance with an embodiment.

FIGS. 11A-11B are front and back view illustrations of a molded package in accordance with an embodiment, using a molding assembly similar to that illustrated in FIGS. 4A-6B. FIG. 11C is a cross-sectional side view illustration of a molded package taken along lines C-C of FIGS. 11A and 11B in accordance with an embodiment. FIG. 11D is a cross-sectional side view illustration of a molded package taken along lines D-D of FIGS. 11A and 11B in accordance with an embodiment. As shown, the molding compound 135M encapsulates the die 166 on the front side 170 of the molding substrate 160 in the area previously defined by the cavity 135. Molding compound 176M may remain on the front side 170 in a portion of the area previously defined by the gate 176. Molding compound 136M encapsulates the die 166 on the back side 172 of the molding substrate 160 in the area previously defined by the cavity 136. Molding compound 152M and 180M may remain on the back side 172 in a portion of the area previously defined by the runner 152 and gate 180. In an embodiment, molding compound plug 161M fills the through-hole 161 running from the front side 170 to the back side 172 of the molding substrate. In an embodiment a gap 182 exists between the molding compound plug 161M and molding compound 135M on the front surface 170 of the molding substrate. The edges of the molding substrate 160 may optionally be cut off after molding. Thus, the molding compound 176M, 177M, 161M, 152M, 180M may optionally be cut from the final molded product.

Figure 12:
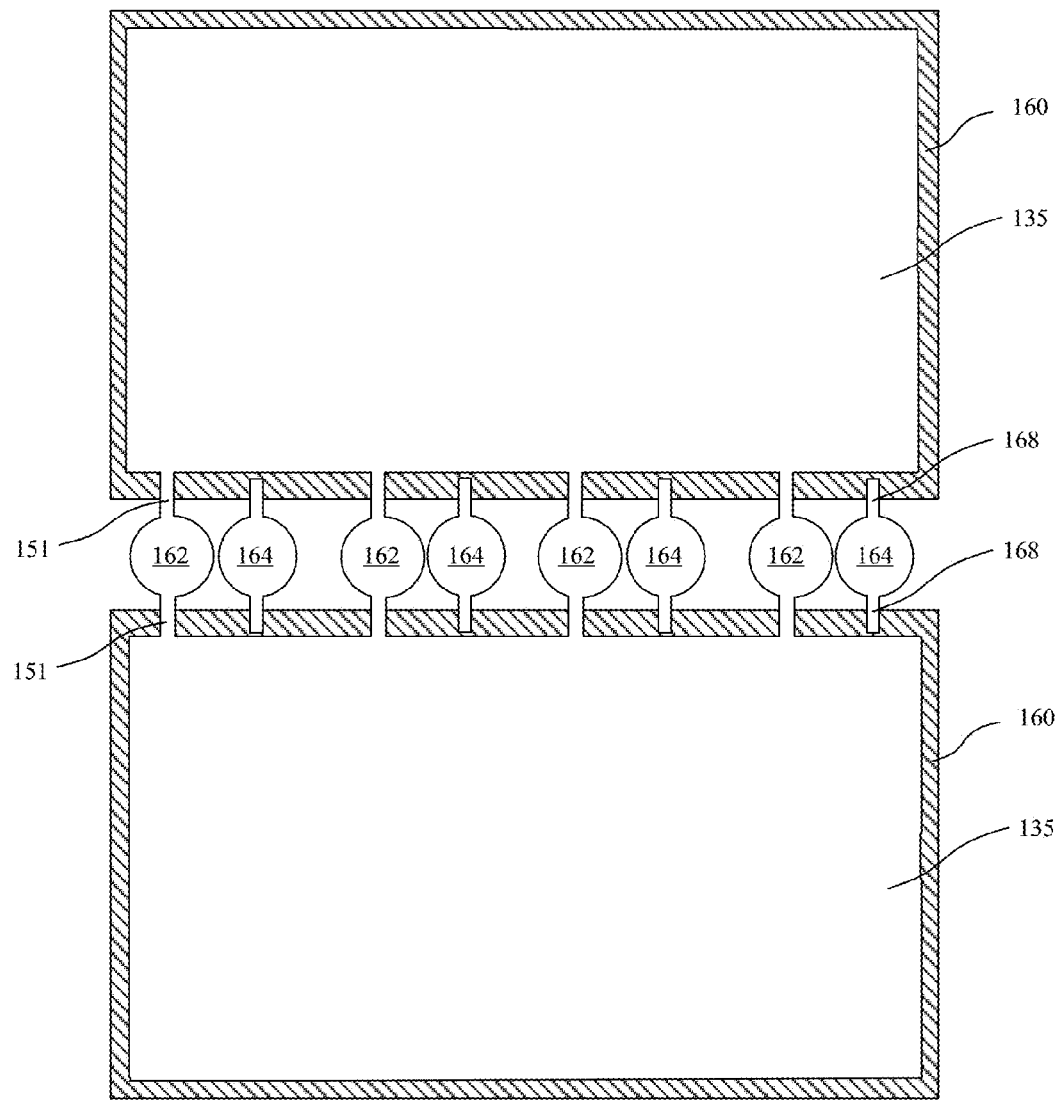
FIG. 12 is a schematic front view illustration of a front mold block and molding substrates in accordance with an embodiment.
Figure 13:
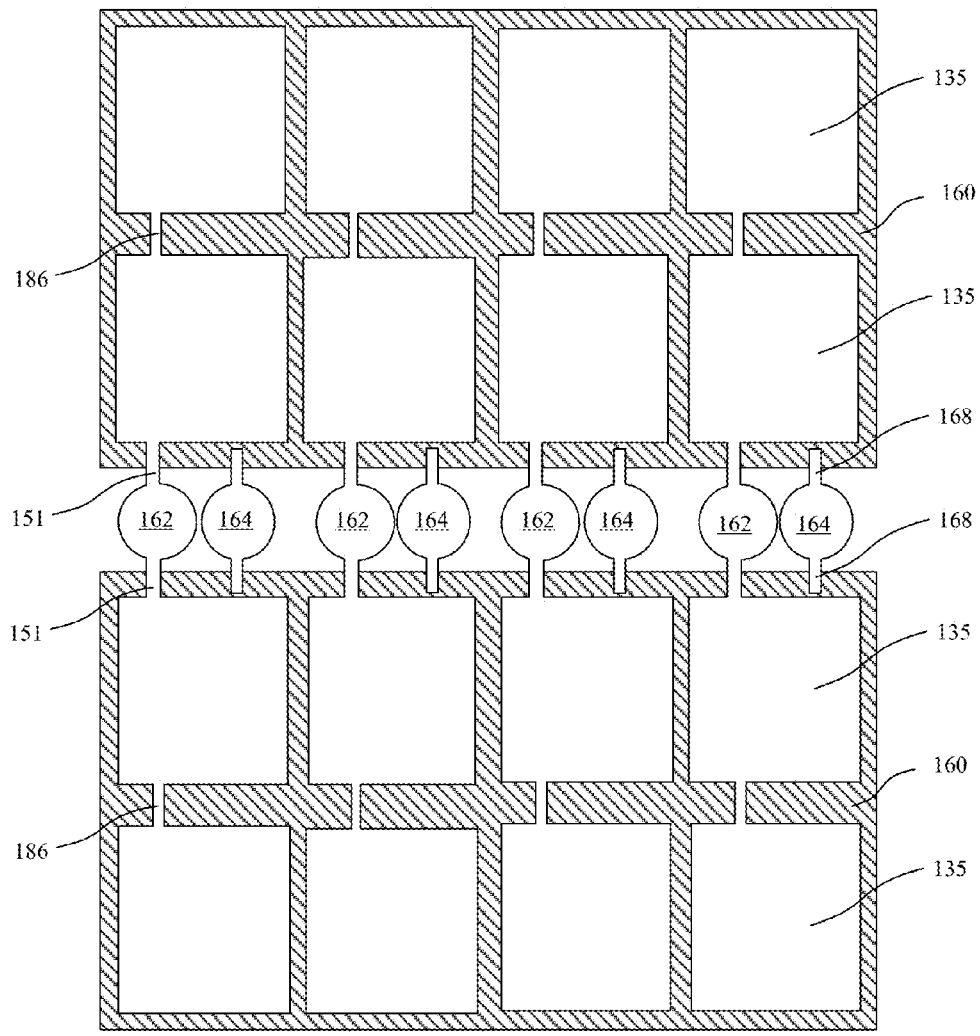
FIG. 13 is a schematic front view illustration of a front mold block and molding substrates in accordance with an embodiment.

Referring now to FIGS. 12-13 schematic front view illustrations are provided that illustrate variations in the designs of the mold blocks and molding substrate assemblies in accordance with embodiments. While the mold block and molding substrate configurations illustrated in FIGS. 12-13 are limited to schematic front view illustrations, it is understood that additional illustrations are not provided in order to not unnecessarily convolute the embodiments. FIGS. 12-13 are illustrative of design variations in accordance with embodiments, and the embodiments may have similarities to those as previously described with regard to FIGS. 4A-4C. In addition, while the above embodiments have been described with regard to the specific mold block arrangements illustrated in FIGS. 4A-4C, embodiments are not so limited and may be applicable to other mold block configurations, such as those illustrated in FIGS. 12-13.

Referring to FIG. 12, a schematic front view illustration is provided for a front mold block and molding substrates in accordance with an embodiment. As illustrated in FIG. 12, the front mold block may include multiple front cavities 135 in fluid communication with first runners 151 and first culls 162. The front mold block may additionally include multiple second culls 164 in fluid communication with intermediate runners 168, which are not in fluid communication with the front cavities 135. In these manners, multiple plungers may be used to simultaneously fill multiple cavities. The corresponding plungers for culls 162 may be independently controllable from the corresponding plungers for culls 164. In addition, the multiple plungers for culls 162 may be independently controllable from one another, and the multiple plungers for culls 164 may be independently controllable from one another. Additional mold block configurations corresponding to FIG. 12 may be similar to those as previously described with regard to FIGS. 4A-4C.

FIG. 13 provides another schematic front view illustration for a front mold block and molding substrates in accordance with an embodiment. FIG. 13 shares similarities to FIG. 4A and FIG. 13. In addition, FIG. 13 illustrates culls 162 feeding into multiple cavities 135, connected by cavity runners 186. Accordingly, a variety of configurations for plungers, runners, and cavities are contemplated in accordance with embodiments.

Figure 14:
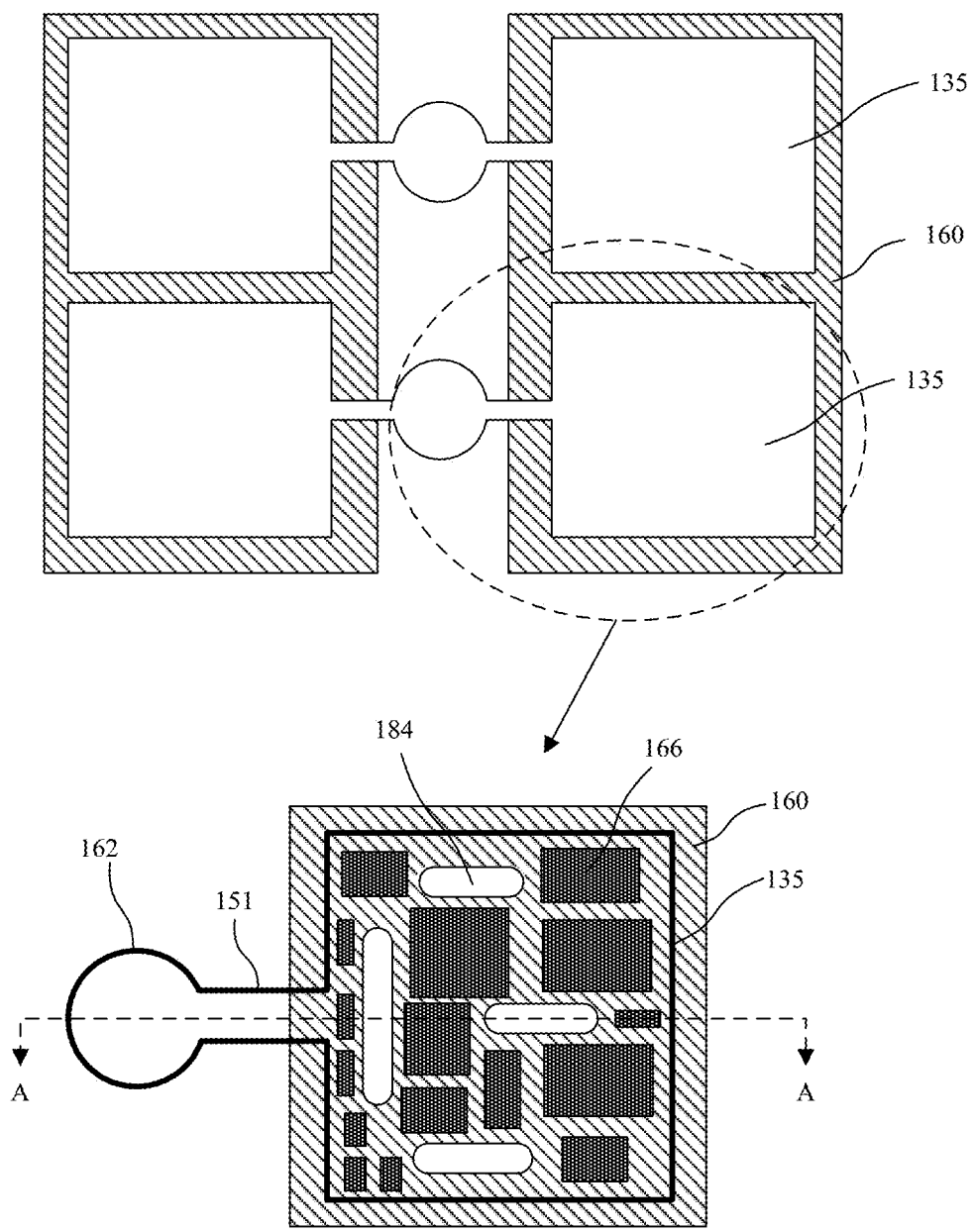
FIG. 14 is a schematic front view illustration and close-up schematic front view illustration of a front mold block and molding substrate in accordance with an embodiment.
Figure 15:
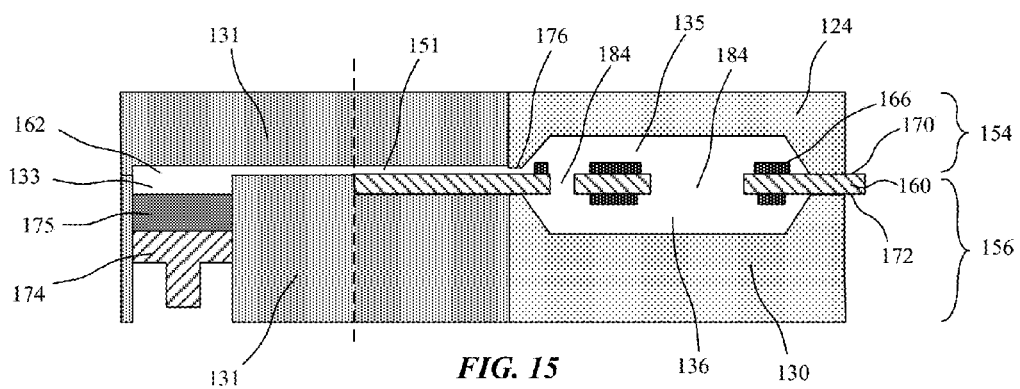
FIG. 15 is a cross-sectional side view illustration of a front mold block, back mold block, and molding substrate taken along line A-A of FIG. 14 in accordance with an embodiment.
Figure 16:
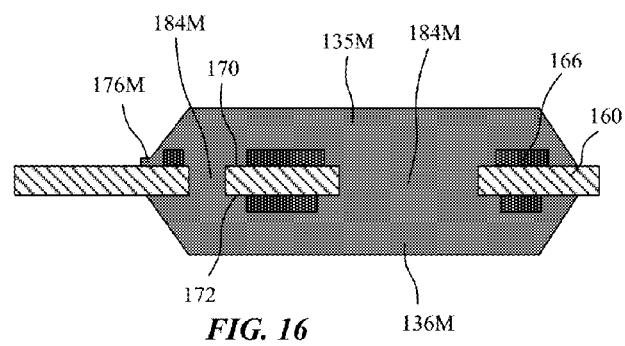
FIG. 16 is a cross-sectional side view illustration of a dual side molded molding substrate taken along line A-A of FIG. 14 in accordance with an embodiment.

Referring now to FIGS. 14-16, an alternative dual side molding configuration is illustrated in accordance with an embodiment. FIG. 14 is a schematic front view illustration and close-up schematic front view illustration of a front mold block and molding substrate in accordance with an embodiment. FIG. 14 is substantially similar to FIG. 4A, with one difference being the omission of cull 164, corresponding plunger, and second runner 168. In addition, the molding substrate 160 includes through-holes, or slots, 184 extending from the front side 170 to the back side 172 of the molding substrate that are confined to within the area reserved from the front cavities 135 and back cavities 136.

FIG. 15 is a cross-sectional side view illustration of a front mold block, back mold block, and molding substrate taken along line A-A of FIG. 14 in accordance with an embodiment. As illustrated, when the front mold block 154 and back mold block 156 are aligned, a fluid path exists from the pot 133, to first cull 162, through the first runner 151, and into the front cavity 135. In an embodiment, a front gate 176 is formed in the front cavity block 124 to define an entrance to the front cavity 135.

FIG. 16 is a cross-sectional side view illustration of a dual side molded molding substrate taken along line A-A of FIG. 14 in accordance with an embodiment. As shown, the molding compound 135M encapsulates the die 166 on the front side 170 of the molding substrate 160 in the area previously defined by the cavity 135. Molding compound 176M may remain on the front side 170 in a portion of the area previously defined by the gate 176. Molding compound 136M encapsulates the die 166 on the back side 172 of the molding substrate 160 in the area previously defined by the cavity 136. In an embodiment, molding compound plug 184M fills the through-holes, or slots, 184 running from the front side 170 to the back side 172 of the molding substrate. In the particular embodiment illustrated in FIG. 16, the molding compound 176M (when present), 135M, 184M, and 136M are a continuous, single molded part. The edges of the molding substrate 160 may optionally be cut off after molding, for example, edges including molding compound 176M may be removed.

While the embodiments illustrated and described with regard to FIGS. 14-16 directed to a dual side molding technique using through vias, or slots 184, located within the cavity areas of the cavity blocks, the embodiments may be compatible with several of the previously described embodiments, or certain aspects thereof. For example, the method of generating plunger assembly parameters illustrated and described with regard to FIG. 9, and the mold flow simulation illustrated and described with regard to FIGS. 10A-10C can also be used with regard to using and designing the molding assembly of FIGS. 14-15 and molded substrate of FIG. 16.

In utilizing the various aspects of the embodiments, it would become apparent to one skilled in the art that combinations or variations of the above embodiments are possible for simultaneous dual side package molding. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A molding assembly comprising:
    a front mold block including:
        a first cull;
        a first runner in fluid communication with the first cull;
        a front cavity in fluid communication with the first runner;
        a second cull; and
        a second runner in fluid communication with the second cull;
        wherein the first runner, the second runner, and the front cavity are formed in a same side of the front mold block, and the second runner is not in fluid communication with the front cavity;
    a back mold block including:
        a first pot alignable with the first cull;
        a second pot alignable with the second cull;
        a back cavity; and
        an intermediate runner alignable with the second runner, and in fluid communication with the back cavity;
        wherein the intermediate runner and the back cavity are formed in a same side of the back mold block;
    wherein a first fluid path exists from the first pot, to the first cull, through the first runner formed in the front mold block, and into the front cavity; and
    wherein a second fluid path exists from the second pot, to the second cull, through the second runner formed in the front mold block, into the intermediate runner formed in the back mold block, and into the back cavity.

2. The molding assembly of claim 1, wherein the first runner is longer than the intermediate runner.

3. The molding assembly of claim 2, wherein the second runner is longer than the intermediate runner.

4. The molding assembly of claim 1, further comprising:
    a first cavity plunger coupled with the first pot;
    a second cavity plunger coupled with the second pot;
    a first actuator coupled with the first cavity plunger; and
    a second actuator coupled with the second cavity plunger; and
    wherein the first and second actuator assemblies are independently controllable.

5. The molding assembly of claim 4, wherein the front mold block includes a front cull block and a front cavity block, and the back mold block includes a back cull block and a back cavity block.

6. The molding assembly of claim 5, wherein the front cull block comprises:
    the first cull;
    the first runner in fluid communication with the first cull;
    the second cull; and
    the second runner in fluid communication with the second cull.

7. The molding assembly of claim 6, wherein the back cull block comprises:
    the first pot alignable with the first cull;
    the second pot alignable with the second cull; and
    the intermediate runner alignable with the second runner.

8. A molding method comprising:
    actuating a first actuator to inject a first molding compound through a first runner and into a front cavity of a front mold block on a front side of a molding substrate;
    actuating a second actuator to inject a second molding compound through a second runner, through a through-hole in the molding substrate from the front side of the molding substrate to a back side of the molding substrate, and into a back cavity of a back mold block on the back side of the molding substrate;
    wherein the second actuator is operated independently of the first actuator.

9. The method of claim 8, wherein the molding substrate is a printed circuit board.

10. The method of claim 8, further comprising injecting the second molding compound through the through-hole in the molding substrate from the front side of the molding substrate to the back side of the molding substrate, into an intermediate runner, and into the back cavity.

11. The method of claim 10, wherein the first and second runners are formed in the front mold block, and the intermediate runner is formed in the back mold block.

12. The method of claim 10, wherein:

the front mold block includes a front cull block and a front cavity block, and the back mold block includes a back cull block and a back cavity block;

the front cull block comprises:
- a first cull;
- the first runner in fluid communication with the first cull;
- a second cull; and
- the second runner in fluid communication with the second cull; and the back cull block comprises:
- a first pot alignable with the first cull;
- a second pot alignable with the second cull; and
- the intermediate runner alignable with the second runner.

13. The method of claim 8, further comprising injecting the first molding compound across the front cavity and injecting the second molding compound across the back cavity with a balanced flow.

\* \* \* \* \*